United States Patent
Kobayashi

(10) Patent No.: US 9,238,366 B2
(45) Date of Patent: Jan. 19, 2016

(54) PIEZOELECTRIC ACTUATOR, LIQUID EJECTING HEAD, AND METHOD OF MANUFACTURING PIEZOELECTRIC ACTUATOR

(71) Applicant: Seiko Epson Corporation, Tokyo (JP)

(72) Inventor: Tomokazu Kobayashi, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/624,695

(22) Filed: Feb. 18, 2015

(65) Prior Publication Data

US 2015/0231884 A1  Aug. 20, 2015

(30) Foreign Application Priority Data

Feb. 19, 2014  (JP) .................................. 2014-029355

(51) Int. Cl.
| | | |
|---|---|---|
| *B41J 2/045* | (2006.01) | |
| *B41J 2/14* | (2006.01) | |
| *H01L 41/09* | (2006.01) | |
| *H01L 41/277* | (2013.01) | |

(52) U.S. Cl.
CPC ......... *B41J 2/14201* (2013.01); *H01L 41/0933* (2013.01); *H01L 41/277* (2013.01)

(58) Field of Classification Search
CPC ............... B41J 2/14201; B41J 2/14233; B41J 2/14274; B41J 2002/14354; H01L 41/0973; H01L 41/0815; H01L 41/1878; H01L 41/318
See application file for complete search history.

(56) References Cited

U.S. PATENT DOCUMENTS

| | | | |
|---|---|---|---|
| 7,604,331 B2 * | 10/2009 | Saito .................... | B41J 2/14233 347/68 |
| 7,810,915 B2 * | 10/2010 | Takabe ................ | B41J 2/14233 310/311 |
| 2014/0210915 A1 | 7/2014 | Isshiki | |

FOREIGN PATENT DOCUMENTS

| | | |
|---|---|---|
| JP | 2005-340428 A | 12/2005 |
| JP | 2011-238774 A | 11/2011 |
| JP | 2012-006182 A | 1/2012 |
| JP | 2014-146772 A | 8/2014 |

* cited by examiner

*Primary Examiner* — Juanita D Jackson

(74) *Attorney, Agent, or Firm* — Harness, Dickey & Pierce, P.L.C.

(57) ABSTRACT

Provided is piezoelectric actuator includes; a vibrating plate; a first electrode provided on the vibrating plate; a first seed layer provided on the first electrode; a second seed layer provided on the vibrating plate at least at a position adjacent to the first electrode; a first piezoelectric layer provided on the first seed layer, the first piezoelectric layer and has a perovskite structure; a second piezoelectric layer that is provided to cover the first piezoelectric layer and the second seed layer; and a second electrode that is provided on the second piezoelectric layer. The first piezoelectric layer and the second piezoelectric layer are preferentially oriented to a (100) face.

13 Claims, 10 Drawing Sheets

PIEZOELECTRIC ACTUATOR, LIQUID EJECTING HEAD, AND METHOD OF MANUFACTURING PIEZOELECTRIC ACTUATOR

BACKGROUND

1. Technical Field

The present invention relates a piezoelectric actuator, a liquid ejecting head, and a method of manufacturing a piezoelectric actuator.

2. Related Art

In a piezoelectric element that is used in an ink jet type recording head that is known as a representative example of a piezoelectric actuator, and the like, it is demanded for a crystal system thereof to be oriented in a (100) face in a rhombohedral crystal so as to actually raise piezoelectric characteristics of a piezoelectric layer. In addition, a method of manufacturing a piezoelectric element is disclosed (for example, refer to JP-A-2011-238774). In the method, a piezoelectric layer composed of lead zircornate titanate (PZT) is formed on a lower electrode through a lead titanate layer in order for the lead zircornate titanate to be preferentially oriented to the (100) face. In addition, a technology, in which a lanthanum nickel oxide (LNO) is used as a seed layer, and a bismuth ferrate-based and bismuth titanate-based piezoelectric layer is preferentially oriented to the (100) face, is disclosed (for example, refer to JP-A-2012-006182). In addition, a buffer layer, which is constituted by a metal element capable of forming a B site of a PZT crystal, is preferentially oriented to the (100) face as a seed layer, is also suggested (for example, refer to JP-A-2005-340428).

However, when manufacturing ink jet type recording head, the piezoelectric layer is also formed on an insulator layer that becomes a nonactive portion in addition to a lower electrode that becomes an active portion, but the piezoelectric layer may not be effectively oriented due to an influence by the base. In addition, there is a problem that fluctuation in the orientation occurs at a boundary between the active portion and the nonactive portion, and thus a degree of orientation locally decreases. Such a decrease in the degree of orientation causes a decrease in an amount of displacement and occurrence of cracks.

In addition, the problem exists not only in the ink jet type recording head but also in other liquid ejecting head that ejects liquid droplets other than ink. In addition, the problem also exists in a piezoelectric element or a piezoelectric actuator which is used in devices other than the liquid ejecting heads.

SUMMARY

An advantage of some aspects of the invention is to provide a piezoelectric actuator capable of allowing a piezoelectric layer to be preferentially oriented to a (100) face regardless of the base, and is capable of suppressing occurrence of cracks without a decrease in an amount of displacement, a liquid ejecting head, and a method of manufacturing a piezoelectric actuator.

According to an aspect of the invention, there is provided a piezoelectric actuator. The piezoelectric actuator includes; a vibrating plate; a first electrode provided on the vibrating plate; a first seed layer provided on the first electrode; a second seed layer provided on the vibrating plate at least at a position adjacent to the first electrode; a first piezoelectric layer provided on the first seed layer, the first piezoelectric layer having a perovskite structure; a second piezoelectric layer provided to cover the first piezoelectric layer and the second seed layer; and a second electrode provided on the second piezoelectric layer. The first piezoelectric layer and the second piezoelectric layer are preferentially oriented to a (100) face. According to this aspect, since the first seed layer and the second seed layer are provided in an active portion and a nonactive portion in a predetermined thickness, respectively, fluctuation in orientation of the piezoelectric layer (the first piezoelectric layer and the second piezoelectric layer) is prevented at a boundary between the active portion and the nonactive portion, and thus it is possible to allow the piezoelectric layer to be preferentially oriented to the (100) face regardless of the base, and it is possible to suppress occurrence of cracks. In addition, it is possible to suppress a decrease in an amount of displacement in the active portion.

Here, it is preferable that the first seed layer have a thickness smaller than a thickness of the second seed layer. According to this, it is possible to reduce an effect on dropping of a voltage applied to the piezoelectric layer in the active portion, and thus it is possible to further suppress the decrease in the amount of displacement.

Here, it is preferable that the thickness of the first seed layer be less than 20 nm. According to this, it is possible to further reduce the effect on the dropping of the voltage applied to the piezoelectric layer, and thus it is possible to reliably suppress the decrease in the amount of displacement.

Here, it is preferable that the thickness of second seed layer be in a range of 20 nm to 80 nm. According to this, the thickness of the second seed layer becomes optimal, and thus fluctuation in orientation of the piezoelectric layer is prevented at a boundary between the active portion and the nonactive portion. Accordingly, it is possible to allow the entirety of the piezoelectric layer to be preferentially oriented to the (100) face in reliable manner, and thus it is possible to further suppress occurrence of cracks.

Here, it is preferable that an occupancy rate of the first seed layer in the first piezoelectric layer be 30% or greater. According to this, an orientation control function of the first seed layer is improved.

Here, it is preferable that the second seed layer extend from the vibrating plate side to the first piezoelectric layer side. According to this, a piezoelectric layer, in which orientation is controlled in a region ranging from the vibrating plate to the first piezoelectric layer, is obtained.

It is preferable that the thickness of the second seed layer on the vibrating plate side be smaller than the thickness on the first piezoelectric layer side. According to this, the piezoelectric layer, in which orientation is controlled, is reliably formed on the vibrating plate.

Here, it is preferable that the first electrode be composed of platinum that is preferentially oriented to a (111) face. According to this, it is possible to provide the piezoelectric layer, which is preferentially oriented to the (100) face, on platinum which is preferentially oriented to the (111) face.

Here, it is preferable that the first seed layer and the second seed layer be composed of a composite oxide having a perovskite structure including bismuth, iron, and titanium. According to this, it is easy to allow the piezoelectric layer to be preferentially oriented to the (100) face.

In addition, according to another aspect of the invention, there is provided a liquid ejecting head including the piezoelectric actuator of the above-described aspect. According to this aspect, it is possible to allow the piezoelectric layer to be preferentially oriented to the (100) face regardless of the base, and thus it is possible to realize a liquid ejecting head capable of suppressing occurrence of cracks without a decrease in the amount of displacement.

In addition, according to still another aspect of the invention, there is provided a method of manufacturing a piezoelectric actuator. The method includes: forming a first electrode, a first seed layer, and a first piezoelectric layer in this order on a vibrating plate; collectively patterning the first electrode, the first seed layer, and the first piezoelectric layer; forming a second seed layer on the vibrating plate at least at a position adjacent to the first electrode; and forming a second piezoelectric layer to cover the first piezoelectric layer and the second seed layer. According to this aspect, it is possible to form the first seed layer and the second seed layer in an arbitrary thickness, respectively. Accordingly, fluctuation in orientation of the piezoelectric layer is prevented at a boundary between an active portion and a nonactive portion, and thus it is possible to allow the piezoelectric layer to be preferentially oriented to the (100) face regardless of the base. As a result, it is possible to provide a method of manufacturing a piezoelectric actuator which is capable of suppressing occurrence of cracks without a decrease in the amount of displacement.

Here, it is preferable that the first seed layer be formed in a thickness smaller than a thickness of the second seed layer. According to this, in the active portion, it is possible to reduce an effect on dropping of a voltage applied to the piezoelectric layer, and thus it is possible to further suppress the decrease in the amount of displacement.

Here, it is preferable that the second seed layer be formed by a liquid phase method. According to this, it is easy to form the first seed layer and the second seed layer in an arbitrary thickness, respectively, and thus fluctuation in orientation at the boundary between the active portion and the nonactive portion is further prevented. As a result, it is possible to allow the entirety of the piezoelectric layer to be reliably oriented to the (100) face regardless of the base, and thus it is possible to suppress occurrence of cracks.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
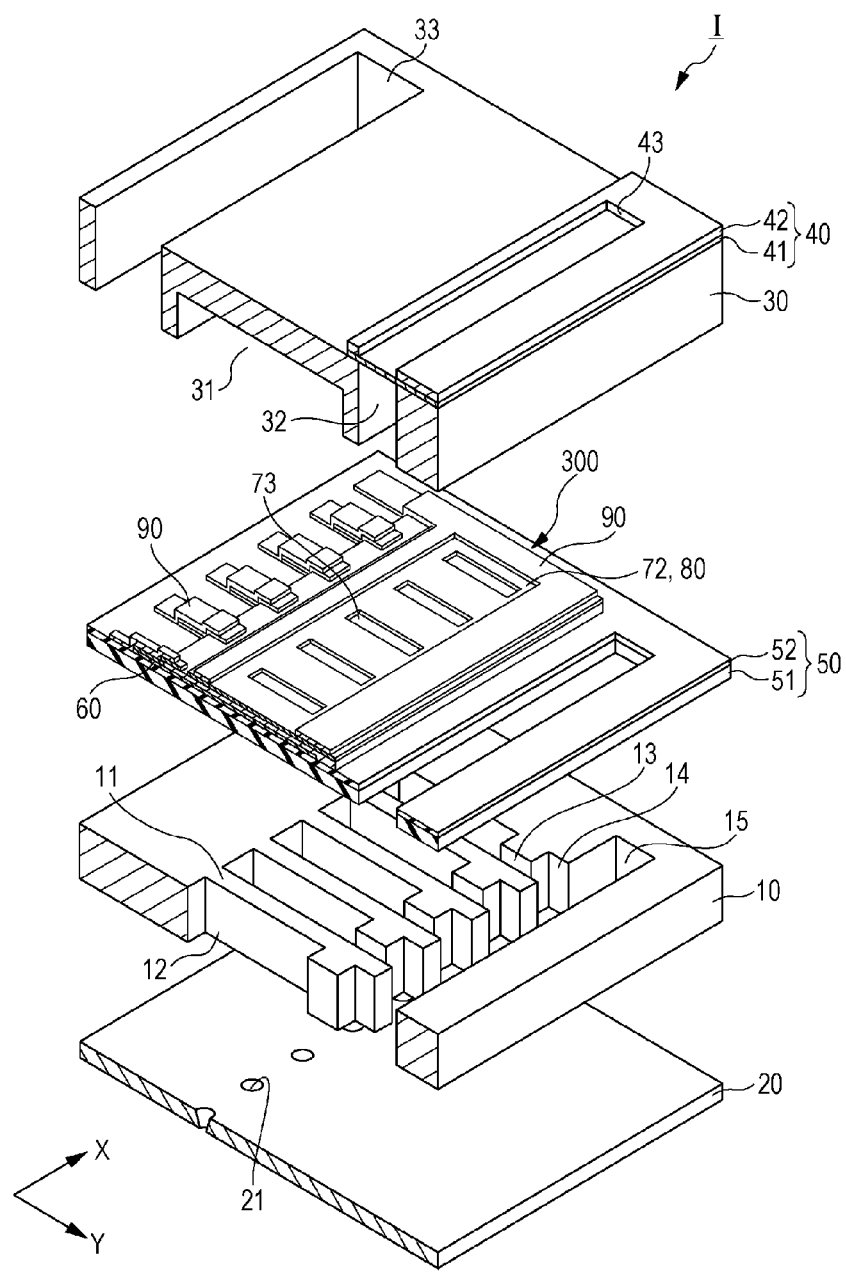
FIG. 1 is an exploded perspective view illustrating a schematic configuration of a recording head according to a first embodiment.
Figure 2:
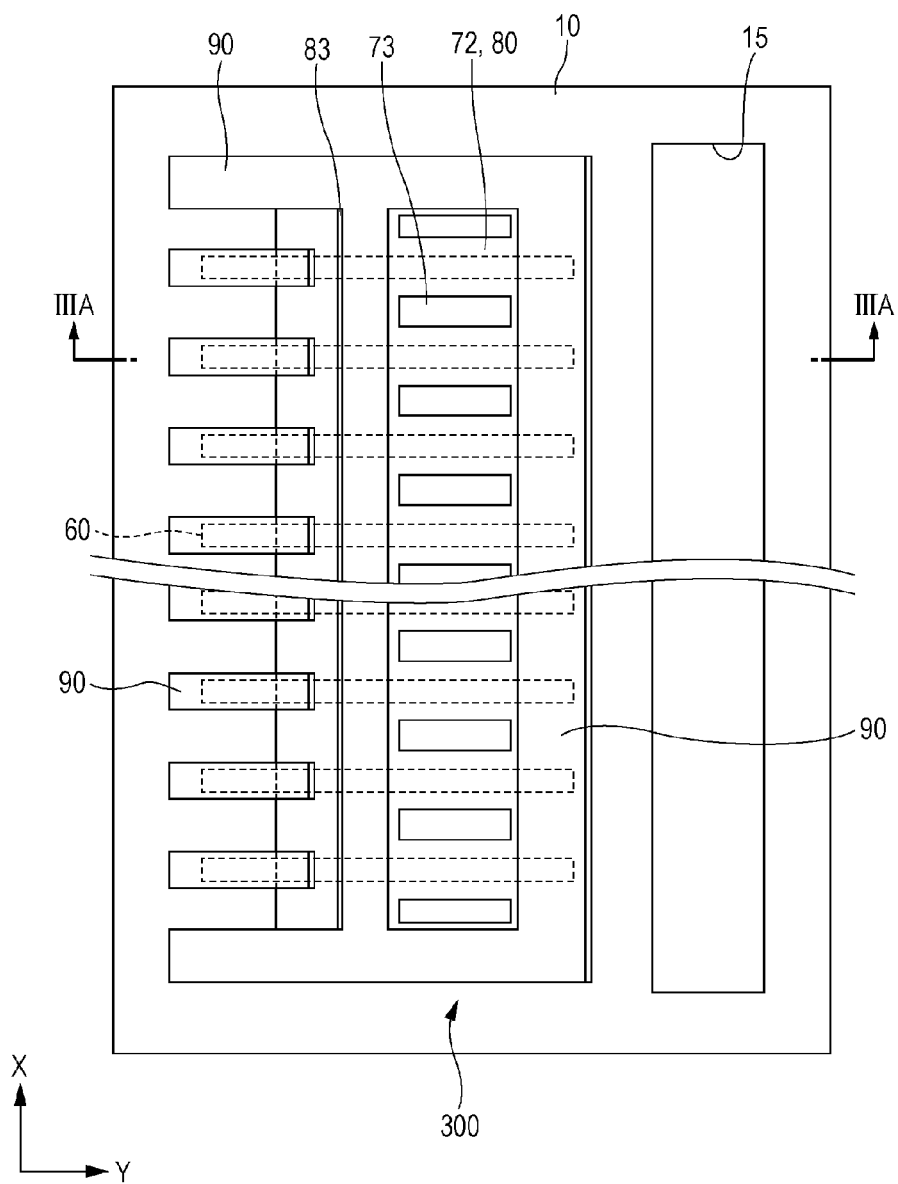
FIG. 2 is a plan view of the recording head according to the first embodiment.
Figure 3A:
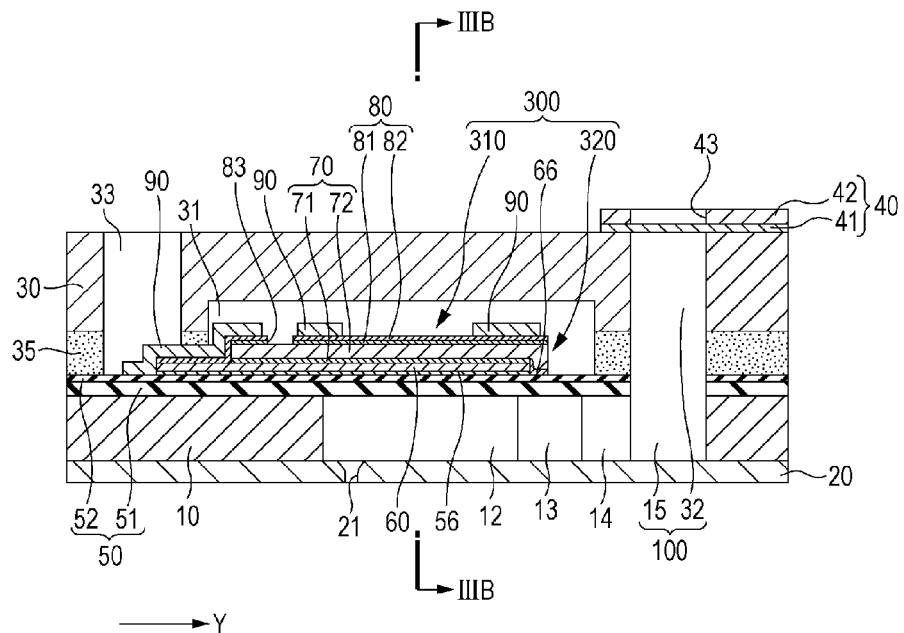
FIGS. 3A and 3B are a cross-sectional view and an enlarged cross-sectional view of a main section of the recording head according to the first embodiment.
Figure 3B:
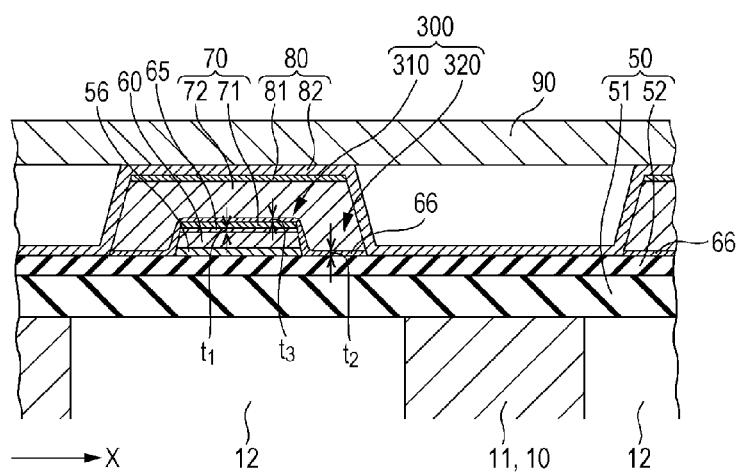

FIG. 1 is an exploded perspective view of an ink jet type recording head that is an example of a liquid ejecting head according to a first embodiment of the invention, and FIG. 2 is a plan view of FIG. 1. In addition, FIG. 3A is a cross-sectional view taken along line IIIA-IIIA in FIG. 2, and FIG. 3B is a cross-sectional view taken along line IIIB-IIIB in FIG. 3A.

As illustrated in the drawings, a pressure generating chamber 12 is formed in a flow passage formed substrate 10 that is provided to a recording head I. A plurality of the pressure generating chambers 12, which are partitioned by a plurality of partition walls 11, are arranged in parallel along a direction in which a plurality of nozzle openings 21 through which the same color of ink is ejected. Hereinafter, the direction is referred to as a parallel arrangement direction of the pressure generating chambers 12 or a first direction X, and a direction that is perpendicular to the first direction X is referred to as a second direction Y.

In addition, on one end side of the flow passage formed substrate 10 in a longitudinal direction of the pressure generating chambers 12, that is, on one end side in the second direction Y perpendicular to the first direction X, ink supply passages 13 and communication passages 14 are partitioned by a plurality of partition walls 11. A communication portion 15, which constitutes a part of a manifold 100 serving as a common ink chamber (liquid chamber) of the pressure generating chambers 12, is formed at the outside of the communication passages 14 (at a side opposite to the pressure generating chambers 12 in the second direction Y). That is, liquid passages, which include the pressure generating chambers 12, the ink supply passages 13, the communication passages 14, and the communication portion 15, are formed in the flow passage formed substrate 10.

A nozzle plate 20, through which each nozzle opening 21 communicating with each of the pressure generating chambers 12 is punched, is bonded to a surface on one side of the flow passage formed substrate 10, that is, a surface from which the liquid passages such as the pressure generating chambers 12 are opened with an adhesive, a thermal welding film, or the like. That is, in the nozzle plate 20, the nozzle openings 21 are arranged in parallel in the first direction X. In addition, for example, the nozzle plate 20 is composed of a glass ceramic, a silicon single crystal substrate, stainless steel, or the like.

A vibrating plate 50 is formed on the other side of the flow passage formed substrate 10. For example, the vibrating plate 50 according to this embodiment is constituted by an elastic film 51 composed of silicon dioxide or the like, and an insulating film 52 composed of zirconium oxide ($ZrO_2$) or the like.

In addition, a first electrode 60, a first seed layer 65 which is provided on the first electrode 60 and of which details will be described later, a first piezoelectric layer 71 that is provided on the first seed layer 65, a second seed layer 66 that is provided on a region ranging from the first piezoelectric layer 71 to the vibrating plate 50 adjacent to the first electrode 60 through a side surface of the first electrode 60, a second piezoelectric layer 72 that is provided on the second seed layer 66, and a second electrode 80 that is provided on the second piezoelectric layer 72 are laminated to constitute a piezoelectric element 300 on an upper side of the insulating film 52 through an adhesive layer 56 composed of titanium or the like. Hereinafter, the first piezoelectric layer 71 and the second piezoelectric layer 72 are also collectively referred to as a piezoelectric layer 70.

Here, the piezoelectric element 300 represents a portion including the first electrode 60, the first seed layer 65, the first piezoelectric layer 71, the second seed layer 66, the second piezoelectric layer 72, and the second electrode 80. In general, any one electrode in the piezoelectric element 300 is set as a common electrode, and the other electrode and the piezoelectric layer 70 are constituted by being patterned for each of the pressure generating chambers 12. In this embodiment, the first electrode 60 is divided for each of the pressure generating chamber 12, and each portion that is divided is set as an individual electrode that is independent for each active portion 310 to be described later. In addition, the second electrode 80 is set as a common electrode of the piezoelectric element 300.

In addition, here, the piezoelectric element 300, and the vibrating plate 50 of which displacement occurs by driving of the piezoelectric element 300 are collectively referred to as a piezoelectric actuator. In addition, in the above-described example, the elastic film 51, the insulating film 52, the adhesive layer 56, and the first electrode 60 may operate as a vibrating plate, but there is no limitation thereto. For example, any one of the elastic film 51, the insulating film 52, and the adhesive layer 56 may not be provided, and only the first electrode 60 may allowed to function as the vibrating plate. In addition, the piezoelectric element 300 itself may be configured to substantially function as the vibrating plate 50. However, in a case of providing the first electrode 60 directly on the flow passage formed substrate 10, it is preferable to protect the first electrode 60 with an insulating protective film or the like in order for the first electrode 60 and ink not to come into contact with each other.

In this embodiment, when a voltage is applied between the first electrode 60 and the second electrode 80, piezoelectric distortion occurs in the first seed layer 65, the first piezoelectric layer 71, the second seed layer 66, and the second piezoelectric layer 72 between the first electrode 60 and the second electrode 80. A portion at which the piezoelectric distortion occurs when a voltage is applied to both the electrodes is referred to as the active portion 310. In contrast, a portion at which the piezoelectric distortion does not occur is referred to as a nonactive portion 320.

Hereinafter, the piezoelectric element 300 that constitutes the piezoelectric actuator will be described in more detail. The first electrode 60 that constitutes the individual electrode is formed with a width that is narrower than a width of the pressure generating chamber 12 in the first direction X thereof. That is, in the first direction X of the pressure generating chamber 12, an end of the first electrode 60 is located on an inner side of a region that faces the pressure generating chamber 12. In addition, in the second direction Y, both ends of the first electrode 60 extend to the outside of the pressure generating chamber 12, respectively.

It is necessary for the first electrode 60 to be formed with a material which is not oxidized when forming the first seed layer 65, the first piezoelectric layer 71, the second seed layer 66, and the second piezoelectric layer 72 and which is capable of retaining conductivity. Examples of the first electrode 60 include a novel metal such as platinum (Pt) and iridium (Ir), and a conductive oxide that is represented by a lanthanum nickel oxide (LNO), and the like. Among these, it is preferable to use platinum. In this embodiment, platinum, which is preferentially oriented to a (111) face, is used as the first electrode 60. Here, the term "preferential orientation" represents that all crystals or the majority of crystals (for example 80% or greater) are oriented to a specific direction, for example, the (111) face or a (100) face. When platinum that is preferentially oriented to the (111) face is used as the first electrode 60, crystallinity of a piezoelectric film can be improved.

The first seed layer 65 and the second seed layer 66 are formed form a composite oxide which has a perovskite structure and includes at least one or more kinds of elements selected from bismuth (Bi), manganese (Mn), iron (Fe), and titanium (Ti). Among these, a composite oxide having a perovskite structure including Bi, Fe, and Ti is preferable from the viewpoint of easy orientation of the piezoelectric layer 70. In the perovskite structure, that is, $ABO_3$ type structure, oxygen is 12-coordinated at an A site, and oxygen is 6-coordinated at a B site, thereby forming an octahedron. For example, in a case where the first seed layer 65 and the second seed layer 66 are composed of a composite oxide including Bi, Fe, and Ti, Bi is located at the A site, Fe and Ti are located at the B site. The first seed layer 65 and the second seed layer 66 function as orientation control layers allowing the first piezoelectric layer 71 and the second piezoelectric layer 72 (piezoelectric layer 70), which has a perovskite structure and are formed on the seed layers, to be preferentially oriented to the (100) face. In addition, the first seed layer 65 and the second seed layer 66 are self-aligned to the (100) face, and thus it is possible to allow the piezoelectric layer 70 to be preferentially oriented to the (100) face with a relatively higher orientation rate. Here, the term "self-alignment to the (100) face" represents that the first seed layer 65 and the second seed layer 66 are preferentially oriented to the (100) face for oneself without being influenced by the base.

Here, it is preferable that the thickness $t_1$ of the first seed layer 65 be smaller than the thickness $t_2$ of the second seed layer 66. As illustrated in FIG. 3B, when the second seed layer 66 is provided on a region ranging from the first piezoelectric layer 71 to the vibrating plate 50 adjacent to the first electrode 60 through a side surface of the first electrode 60, the "thickness $t_2$ of the second seed layer 66" stated here represents a thickness $t_2$ on the vibrating plate 50 adjacent to the first electrode 60, that is, a thickness $t_2$ on the vibrating plate 50 (insulating film 52) of the nonactive portion 320. Specifically, it is preferable that the thickness $t_1$ of the first seed layer 65 be less than 20 nm, and it is preferable that the thickness $t_2$ of the second seed layer 66 be 20 nm to 80 nm. When the thickness $t_1$ of the first seed layer 65 is set to be less than 20 nm, in the active portion, it is possible to reduce an effect on dropping of voltage that is applied to the piezoelectric layer 70, and thus it is possible to suppress a decrease in an amount of displacement. On the other hand, when the thickness $t_2$ of the second seed layer 66 is set to 20 nm to 80 nm, fluctuation in orientation of the piezoelectric layer is prevented at a boundary between the active portion and the nonactive portion. Accordingly, it is possible to allow the entirety of the piezoelectric layer to be preferentially oriented to the (100) face, and thus it is possible to suppress occurrence of cracks.

In addition, it is more preferable that the first seed layer 65 be provided in an island shape. Here, the first seed layer may be formed in a film shape or an island shape by controlling a dilution rate of a material solution or firing conditions. The island shape represents a state in which crystals separately or independently exists without forming a film over an entire surface due to agglomeration and the like. An occupancy rate of the island shape in the piezoelectric layer surface that is covered is preferably 30% or greater, and more preferably 60% or greater. When the occupancy rate is 30% or greater, an orientation control function is improved, and when the occupancy rate is 60% or greater, it contributes to an improvement in crystallinity of the piezoelectric layer. According to this, a voltage is effectively applied to the piezoelectric layer 70 without being distributed to the first seed layer 65. Accordingly, it is possible to further suppress a decrease in the amount of displacement.

In addition, it is preferable that a thickness $t_3$ (refer to FIG. 3B) of the second seed layer 66 provided on the first piezoelectric layer 71 of the active portion 310 be as small as possible. Specifically, the thickness $t_3$ may be less than 20 nm or may be as small as zero, or the second seed layer 66 may not be provided. When the thickness $t_3$ of the second seed layer 66 is made to be very small, as is the case with the first seed layer 65, it is possible to reduce an effect on dropping of a voltage that is applied to the piezoelectric layer 70, and thus it is possible to suppress a decrease in the amount of displacement.

As described above, to make the thickness on the first piezoelectric layer 71 of the active portion 310 and the thickness on the vibrating plate 50 of the nonactive portion 320 or on side surface of the first electrode 60 different from each other, it is preferable to form the second seed layer 66 by a chemical solution method such as a metal-organic decomposition (MOD) method and a sol-gel method, that is, a liquid phase method. According to the liquid phase method, for example, even when applying a precursor solution of the seed layer on the first piezoelectric layer 71 (an upper side of the first electrode 60), the precursor solution flows to the vibrating plate 50 adjacent to the first electrode 60, and thus the second seed layer 66 (second seed layer precursor film) is formed in a small thickness (thickness $t_3$) on the first piezoelectric layer 71, and in a large thickness (thickness $t_2$) on the vibrating plate 50 or on the side surface of the first electrode 60.

In addition, the first seed layer 65 and the second seed layer 66 may be composed of a composite oxide in which parts of elements at the A site or the B site are substituted with other elements in a range not deteriorating the orientation function, and these seed layers are also included in the first seed layer 65 and the second seed layer 66 of the invention. For example, an element such as Ba and La other than Bi may further exist at the A site, and an element such as Zr and Nb may further exist at the B site in combination with Fe and Ti. In addition, seed layers having a configuration deviating from a stoichiometric composition ($ABO_3$) due to deficiency or excess of elements (Bi, Fe, Ti, O) are also included in the first seed layer 65 and the second seed layer 66 of the invention as long as the above-described function is provided.

In addition, the first seed layer 65 and the second seed layer 66 have the same perovskite structure as the following piezoelectric material that forms the piezoelectric layer 70, and has piezoelectric characteristics although the magnitude thereof is small, and the first seed layer 65, the second seed layer 66, and the piezoelectric layer 70 can be collectively referred to as a piezoelectric layer.

The piezoelectric layer 70 is a piezoelectric material composed of a composite oxide having a perovskite structure, that is, the $ABO_3$ type structure. Examples of the piezoelectric material include a piezoelectric material having a lead-free based perovskite structure that does not include lead. Examples of the lead-free based piezoelectric material include bismuth ferrate (($BiFeO_3$), abbreviated as "BFO"), barium titanate (($BaTiO_3$), abbreviated as "BT"), potassium sodium niobate ((K, Na)($NbO_3$), abbreviated as "KNN"), potassium sodium lithium niobate ((K, Na, Li)($NbO_3$)), potassium sodium lithium niobate tantalate ((K, Na, Li)(Nb, Ta)$O_3$), bismuth potassium titanate (($Bi_{1/2}K_{1/2}$)$TiO_3$, abbreviated as "BKT"), bismuth sodium titanate (($Bi_{1/2}Na_{1/2}$)$TiO_3$, abbreviated as "BNT"), bismuth manganate ($BiMnO_3$, abbreviated as "BM"), and the like. In addition, examples of the piezoelectric material further include a composite oxide including bismuth, potassium, titanium, and iron ((Bi, K)(Ti, Fe)$O_3$), a composite oxide including bismuth, iron, barium, and titanium ((Bi, Ba)(Fe, Ti)$O_3$), a composite oxide ((Bi, Ba)(Fe, Ti, M)$O_3$)(M represents Mn, Co, Cr), which is obtained by adding a metal such as manganese, cobalt, and chromium to the composite oxide, and the like.

In addition, a lead-based piezoelectric material that includes lead, for example, lead titanate zirconate (PZT), or a material obtained by adding a metal oxide such as a niobium oxide, a nickel oxide and a magnesium oxide to the lead-based piezoelectric material may also be used without limitation to the lead-free based piezoelectric material that does not include lead. Specific example of the lead-based piezoelectric material include lead titanate ($PbTiO_3$), lead zirconate titanate (Pb(Zr, Ti)$O_3$), lead zirconate ($PbZrO_3$), lead lanthanum titanate ((Pb, La), $TiO_3$), lead lanthanum zirconate titanate ((Pb, La)(Zr, Ti)$O_3$), lead magnesium niobate zirconate titanate (Pb(Zr, Ti) (Mg, Nb)$O_3$), and the like.

When being formed on the first seed layer 65 and the second seed layer 66, the above-described piezoelectric material having the perovskite structure is preferentially oriented to the (100) face. Specifically, as illustrated in the following examples, it is confirmed that the piezoelectric layer 70 is preferentially oriented to the (100) face with an orientation rate as high as at least 88% or greater. The orientation rate stated here is set as a value (100)/[(100)+(110)] when comparing a peak intensity derived from the (100) face and a peak intensity derived from the (110) face in diffraction peaks according to an X-ray diffraction (XRD) method. The higher the orientation rate is, the more preferable when considering displacement characteristics of the piezoelectric layer 70 and an improvement in durability. (100)/[(100)+(110)] is preferably 80% or greater, and more preferably 90% or higher. In addition, it is preferable that the piezoelectric layer 70 be composed of a rhombohedral crystal from the viewpoint that the rhombohedral crystal is preferentially oriented to the (100) face and has excellent displacement characteristics.

The second piezoelectric layer 72, which constitutes the piezoelectric layer 70, is continuously provided along the first direction X with a predetermined width in the second direction Y. The width of the second piezoelectric layer 72 in the second direction Y is greater than the length of the pressure generating chamber 12 in the second direction Y. According to this, the second piezoelectric layer 72 is provided up to an outer side of the pressure generating chamber 12 in the second direction Y of the pressure generating chamber 12.

In the second direction Y of the pressure generating chamber 12, an end of the second piezoelectric layer 72 on an ink supply passage 13 side is located on an outer side in comparison to an end of the first electrode 60. That is, the end of the first electrode 60 is covered with the second piezoelectric layer 72. In addition, an end of the second piezoelectric layer 72 on a nozzle opening 21 side is located on an inner side (on a pressure generating chamber 12 side) in comparison to the end of the first electrode 60, and an end on a nozzle opening 21 side of the first electrode 60 is not covered with the second piezoelectric layer 72.

In addition, a concave portion 73 corresponding to each of the partition walls 11 is formed in the second piezoelectric layer 72. A width of the concave portion 73 in the first direction X is substantially the same as or broader than a width of the partition wall 11 in the first direction X. According to this, it is possible to suppress rigidity of a portion of the vibrating plate 50 (a so-called arm portion of the vibrating plate 50) which faces an end of the pressure generating chamber 12 in the second direction Y, and thus it is possible to displace the piezoelectric element 300 in a satisfactory manner.

The second electrode 80 is provided on a surface of the second piezoelectric layer 72 which is opposite to the first electrode 60, and is configured as a common electrode that is common to a plurality of the active portions 310. In this embodiment, the second electrode 80 includes a first layer 81 that is provided on a second piezoelectric layer 72 side, and a second layer 82 that is provided on a side of the first layer 81 which is opposite to the second piezoelectric layer 72. However, the second layer 82 may be omitted.

In this embodiment, the first layer 81 is composed of an iridium layer, and in a case of the second piezoelectric layer 72 including an excessive component, for example, lead that exists on a surface (a second electrode side) of the second piezoelectric layer 72, the first layer 81 has a function of absorbing the excessive lead on the surface of the second piezoelectric layer 72, thereby improving piezoelectric characteristics of the second piezoelectric layer 72. The first layer 81 is formed on the second piezoelectric layer 72, that is, on a surface of the second piezoelectric layer 72 which is opposite to the flow passage formed substrate 10.

In addition, the second layer 82, which constitutes the second electrode 80, may be formed by using a material, for example, a metal material such as iridium (Ir), platinum (Pt), palladium (Pd), and gold (Au) which have conductivity. The second layer 82 may be formed from a single material of the metal material, or a plurality of materials which are mixed with each other. In this embodiment, the second layer 82 is continuously provided on the first layer 81, on a side surface of the second piezoelectric layer 72 on which the first layer 81 is not provided, and on the first electrode 60.

A lead electrode 90 is connected to the first electrode 60 and the second electrode 80 of the piezoelectric element 300. The lead electrode 90 can be formed by forming the lead electrode 90 on the entire surface on one side of the flow passage formed substrate 10, and patterning the lead electrode 90 in a predetermined shape.

A protective substrate 30, which protects the piezoelectric element 300, is bonded to the flow passage formed substrate 10, on which the piezoelectric element 300 is formed, with an adhesive 35. A piezoelectric element retaining portion 31, which is a concave portion defining a space for accommodation of the piezoelectric element 300, is provided to the protective substrate 30. In addition, a manifold portion 32, which constitutes a part of the manifold 100, is provided to the protective substrate 30. The manifold portion 32 passes through the protective substrate 30 in a thickness direction (a direction perpendicular to the first direction X and the second direction Y) and is formed over a width direction of the pressure generating chamber 12. The manifold portion 32 communicates with the communication portion 15 of the flow passage formed substrate 10.

A through-hole 33 that passes through the protective substrate 30 in a thickness direction thereof is formed in the protective substrate 30. The lead electrode 90, which is connected to the first electrode 60 of each of the active portion 310, is provided to be exposed in the through-hole 33.

A compliance substrate 40 including a sealing film and a fixed plate 42 is bonded to the protective substrate 30, and one surface of the manifold portion 32 is sealed with the sealing film 41. In addition, a region of the fixed plate 42, which faces the manifold 100, is configured of an opening 43 obtained by completely removing the fixing plate 42 in a thickness direction thereof, and one surface of the manifold 100 is sealed with only the sealing film 41.

In the ink jet type recording head of this embodiment, ink is introduced from an ink inlet that is connected to an external ink supply unit (not illustrated), and the inside of ink jet type recording head is filled with the ink until the ink reaching the nozzle opening 21 from the manifold 100. Then, a voltage is applied between the first electrode 60 corresponding to each of the pressure generating chambers 12 and the second electrode 80 in response to a recording signal transmitted from a drive circuit (not illustrated) to deform the vibrating plate 50, the adhesive layer 56, the first electrode 60, the first seed layer 65, the first piezoelectric layer 71, the second seed layer 66, and the second piezoelectric layer 72. According to the application of the voltage, a pressure inside each of the pressure generating chamber 12 is raised, and thus an ink droplet is ejected from the nozzle opening 21.

Next, an example of a method of manufacturing the ink jet type recording head of this embodiment will be described with reference to FIGS. 4A to 7C. In addition, FIGS. 4A to 7C are cross-sectional views in a longitudinal direction (second direction) of the pressure generating chamber.

Figure 4A:
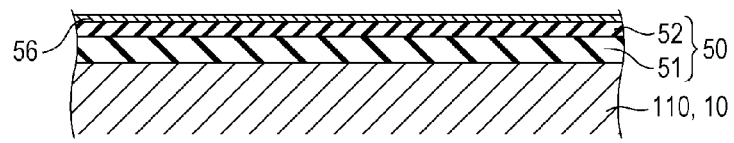
FIGS. 4A to 4D are cross-sectional views illustrating a process of manufacturing the recording head according to the first embodiment.

First, as illustrated in FIG. 4A, an elastic film 51, which constitutes the vibrating plate 50 and is composed of silicon dioxide ($SiO_2$) or the like, is formed on a surface of a wafer for a flow passage formed substrate which is a silicon wafer, and the insulting film 52 composed of a zirconium oxide or the like is formed on the elastic film 51. Next, an adhesive layer 56 composed of a titanium oxide or the like is formed on an entire surface of the insulating film 52 by a sputtering method, a thermal oxidation, or the like.

Figure 4B:
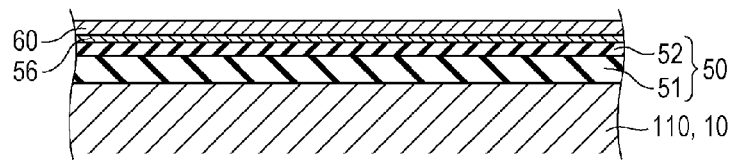
Figure 4C:
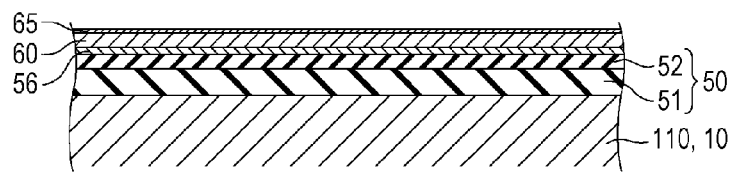

Next, as illustrated in FIG. 4B, the first electrode 60 composed of platinum is formed on an entire surface of the insulating film 52 by a sputtering method, a deposition method, or the like. Next, as illustrated in FIG. 4C, the first seed layer 65 is formed on the first electrode 60. In this embodiment, description will be given to a case of forming the first seed layer 65 composed of a composite oxide which has a perovskite structure and in which the A site includes Bi and the B site includes Fe and Ti. The above-described first seed layer 65 can be formed by using a chemical solution method such as a metal-organic decomposition (MOD) method and a sol-gel method, that is, a liquid phase method in which a first seed layer precursor film (not illustrated) is formed through application and drying of a solution including, for example, a metal complex, and the first seed layer precursor film is fired to obtain the first seed layer 65. In addition, the first seed layer 65 can be formed by a laser ablation method, a sputtering method, a pulse laser deposition (PLD) method, a CVD method, an aerosol deposition method, and the like.

As a specific formation sequence example in the case of forming the first seed layer 65 by the chemical solution method (liquid phase method), first, a seed layer forming composition (a seed layer precursor solution), which is composed of an MOD solution or sol that includes metal complexes containing Bi, Fe, and Ti, is applied by using a spin coating method or the like to form the first seed layer precursor film (not illustrated) (a seed layer precursor solution applying process).

The seed layer precursor solution that is applied is a solution obtained by mixing metal complexes capable of forming a composite oxide in which Bi is included at the A site and Fe and Ti are included at the B site through firing, and by dissolving or dispersing the resultant mixture in an organic solvent. As the metal complexes which include Bi, Fe, and Ti, respectively, for example, an alkoxide, an organic acid salt, β-diketone complex, and the like may be used. Examples of the metal complex, which contains Bi, include bismuth 2-ethylhexanoate, bismuth acetate, and the like. Examples of the metal complex, which contains Fe, include iron 2-ethylhexanoate, iron acetate, iron tris(acetyl acetonate), and the like. Examples of the metal complex, which contains Ti, include titanium 2-ethylhexanoate, titanium acetate, and the like. In addition, examples of a solvent of the seed layer precursor solution include propanol, butanol, pentanol, hexanol, octanol, ethylene glycol, propylene glycol, octane, decane, cyclohexane, xylene, toluene, tetrahydrofuran, acetic acid, octyl acid, and the like.

Next, the first seed layer precursor film is heated to a predetermined temperature (for example, 150° C. to 200° C.), and is dried for a constant time (a seed layer drying process). Next, the first seed layer precursor film that is dried is heated to a predetermined temperature (for example, 350° C. to 450° C.) and is retained for a constant time to perform degreasing (a seed layer degreasing process). The degreasing stated here represents that an organic component included in the first seed layer precursor film is withdrawn, for example, as $NO_2$, $CO_2$, $H_2O$, and the like. An atmosphere of the seed layer drying process or the seed layer degreasing process is not limited, and the processes may be performed in the air, in an oxygen atmosphere, or in an inert gas.

Next, the first seed layer precursor film is heated to a predetermined temperature, for example, approximately 600° C. to 850° C., and is retained for a constant time, for example, 1 minute to 10 minutes for crystallization, thereby forming the first seed layer 65 composed of a composite oxide which has a perovskite structure and in which Bi is included at the A site and Fe and Ti are included at the B site (a seed layer firing process).

Even in the seed layer firing process, an atmosphere is not limited, and the process may be performed in the air, in an oxygen atmosphere, or in an inert gas. Examples of a heating device, which is used in the seed layer drying process, the seed layer degreasing process, and the seed layer firing process, include a rapid thermal annealing (RTA) device that performs heating with irradiation of an infrared lamp, a hot plate, and the like.

When providing the first seed layer 65 as described above, the first piezoelectric layer 71, which is formed on the first seed layer 65, is allowed to be preferentially oriented to the (100) face.

Figure 4D:
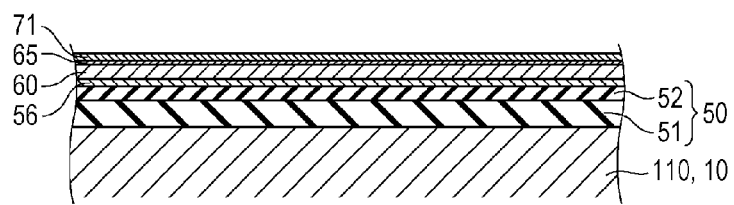

Next, as illustrated in FIG. 4D, the first piezoelectric layer 71 is formed on the first seed layer 65. In this embodiment, description will be given to a case of forming the first piezoelectric layer 71 composed of a composite oxide having a perovskite structure including Bi, Ba, Fe, and Ti. As is the case with the first seed layer 65, the first piezoelectric layer 71 can be formed by performing application and drying of a solution that includes, for example, metal complexes, and by performing degreasing. In addition, the first piezoelectric layer 71 can be formed by a laser ablation method, a sputtering method, a pulse laser deposition (PLD) method, a CVD method, an aerosol deposition method, and the like.

As a specific formation sequence example in the case of forming the first piezoelectric layer 71 by the chemical solution method (liquid phase method), first, an oxide layer forming composition (a precursor solution), which is composed of an MOD solution or sol that includes metal complexes, specifically, metal complexes containing Bi, Ba, Fe, and Ti, is applied to the first seed layer 65 by using a spin coating method or the like to form a first piezoelectric precursor film (not illustrated) (an application process).

The precursor solution that is applied is a solution obtained by mixing metal complexes capable of forming the first piezoelectric precursor film that include Bi, Ba, Fe, and Ti through firing, and by dissolving or dispersing the resultant mixture in an organic solvent. In addition, in a case of forming a first piezoelectric precursor film that includes Mn, Co, or Cr, a precursor solution, which includes metal complexes containing Mn, Co, or Cr, is used. A mixing ratio of the metal complexes, which contain Bi, Ba, Fe, Ti, Mn, Co, and Cr, respectively, may be set in order for respective metals to have a desired molar ratio. As the metal complexes which contain Bi, Ba, Fe, Ti, Mn, Co, and Cr, respectively, for example, an alkoxide, an organic acid salt, β-diketone complex, and the like may be used. As the metal complexes which contain Bi, Fe, and Ti, the same metal complexes which are used when forming the first seed precursor film can be used. Examples of the metal complex, which includes Ba, include barium acetate, barium isopropoxide, barium 2-ethylhexanoate, barium acetylacetonate, and the like. Examples of the metal complex, which contains Mn, include manganese 2-ethylhexanoate, manganese acetate, and the like. Examples of an organic metal compound, which contains Co, include cobalt 2-ethylhexanoate, cobalt (III) acetylacetonate, and the like. Examples of an organic metal compound, which contains Cr, include chromium 2-ethylhexanoate, and the like. A metal complex, which contains two or more kinds of Bi, Ba, Fe, Ti, Mn, Co, and Cr, may be used. In addition, examples of a solvent of the precursor solution include propanol, butanol, pentanol, hexanol, octanol, ethylene glycol, propylene glycol, octane, decane, cyclohexane, xylene, toluene, tetrahydrofuran, acetic acid, octyl acid, and the like.

Next, the first piezoelectric precursor film is heated to a predetermined temperature, for example, approximately 130° C. to 180° C., and is dried for a constant time (a drying process). Next, the first piezoelectric precursor film that is dried is heated to a predetermined temperature (for example, 300° C. to 400° C.) and is retained for a constant time to perform degreasing (a degreasing process). In addition, the degreasing stated here represents that an organic component included in the first piezoelectric precursor film is withdrawn, for example, as $NO_2$, $CO_2$, $H_2O$, and the like.

Next, the first piezoelectric precursor film is heated to a predetermined temperature, for example, approximately 650° C. to 800° C., and is retained for a constant time for crystallization, thereby forming the first piezoelectric layer 71 (firing process). Examples of a heating device, which is used in the drying process, the degreasing process, and the firing process, include a rapid thermal annealing (RTA) device that performs heating with irradiation of an infrared lamp, a hot plate, and the like.

In addition, the first piezoelectric layer 71 composed of a single-layered composite oxide is formed, but the first piezoelectric layer 71, which is composed of a multi-layered composite oxide, may be formed by repeating the application process, the drying process, and the degreasing process, or the application process, the drying process, the degreasing process, and the firing process a plurality of times in accordance with a desired film thickness, and the like.

Figure 5A:
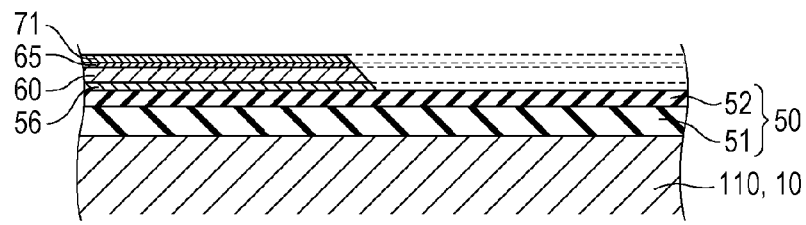
FIGS. 5A to 5D are cross-sectional views illustrating a process of manufacturing the recording head according to the first embodiment.

Next, as illustrated in FIG. 5A, the adhesive layer 56, the first electrode 60, the first seed layer 65, and the first piezoelectric layer 71 are collectively patterned by using a resist (not illustrated) having a predetermined shape as a mask on the first piezoelectric layer 71.

Figure 5B:
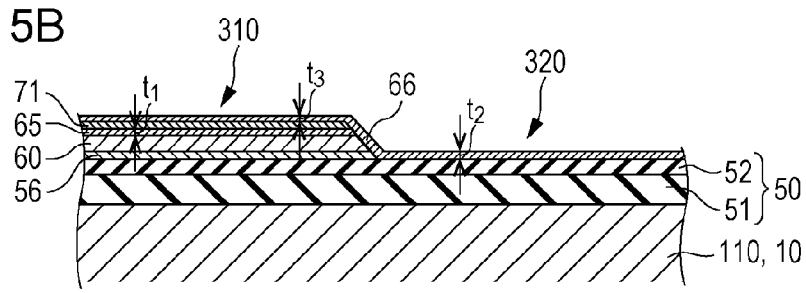

Next, as illustrated in FIG. 5B, after peeling off the resist, the second seed layer 66 is formed the first piezoelectric layer 71, and on the insulating film 52 on both sides of the first piezoelectric layer 71 at least in a width direction thereof. As is the case with the first seed layer 65, for example, the second seed layer 66 can be formed by using a chemical solution method (liquid phase method) such as a metal-organic decomposition (MOD) method and a sol-gel method in which a precursor solution including a metal complex is applied to form a second seed layer precursor film (not illustrated), and the precursor film is dried and fired to obtain the second seed layer 66 composed of a composite oxide. The second seed layer 66 can be formed by using a laser ablation method, a sputtering method, a pulse laser deposition (PLD) method, a CVD method, an aerosol deposition method, and the like.

In this embodiment, the second seed layer 66, of which thickness is different on the first piezoelectric layer 71 of the active portion 310, and on the vibrating plate 50 of the nonactive portion 320 or on the side surface of the first electrode 60, is formed by a liquid phase method. Specifically, the second seed layer 66 (second seed layer precursor film), which has a small thickness on the first electrode 60 of the active portion 310 (thickness $t_3$) and a large thickness on the vibrating plate 50 of the nonactive portion 320 (on the side surface of the first electrode 60) (thickness $t_2$ ($t_2 > t_3$)), formed. In addition, the thickness $t_2$ is set to be larger than the thickness $t_1$ of the first seed layer 65. As described above, the first seed layer 65 and the second seed layer 66 are formed in a thickness that is different in each case, and thus fluctuation in orientation of the piezoelectric layer 70 at a boundary between the active portion and the nonactive portion is prevented, and thus it is possible to allow the piezoelectric layer to be preferentially oriented to the (100) face regardless of the base, and thus it is possible to suppress occurrence of cracks.

Figure 5C:
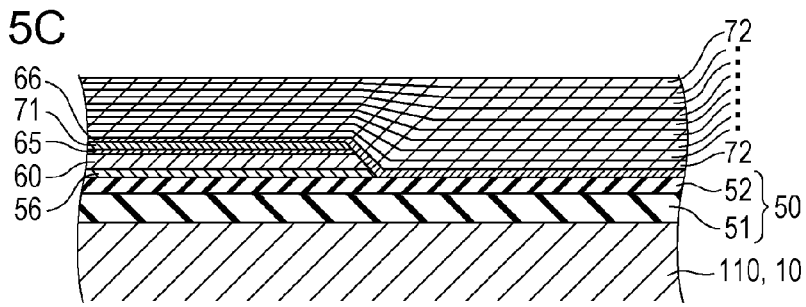
Figure 5D:
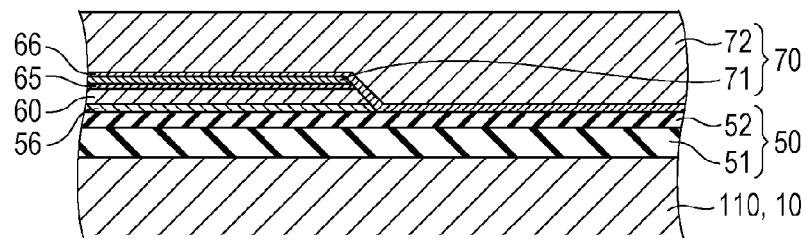

Next, as illustrated in FIG. 5C, the second piezoelectric layer 72 is formed on the second seed layer 66. In this embodiment, as is the case with the above-described first piezoelectric layer 71, the second piezoelectric layer 72 composed of a composite oxide which includes a perovskite structure and includes Bi, Ba, Fe, and Ti is formed by a liquid phase method. In addition, the second piezoelectric layer 72 can be formed by a laser ablation method, a sputtering method, a pulse laser deposition (PLD) method, a CVD method, an aerosol deposition method, and the like. A sequence of forming the second piezoelectric layer 72 is the same as in the first piezoelectric layer 71. However, in the second piezoelectric layer 72, a multi-layered second piezoelectric layer 72 is formed by repeating the application process, the drying process, and the degreasing process, or the application process, the drying process, the degreasing process, and the firing process a plurality of times in accordance with a desired film thickness, thereby forming the piezoelectric layer 70 (FIG. 5D). For example, in a case where a film thickness obtained by the application solution for each time is 0.1 μm, the total film thickness of the piezoelectric layer 70 including a single-layered first piezoelectric layer 71 and 10-layered second piezoelectric layer 72 becomes approximately 1.1 μm. In addition, in this embodiment, the second piezoelectric layer is provided through lamination of 10 layers, but the second piezoelectric layer 72 may be formed in a single layer.

Figure 6A:
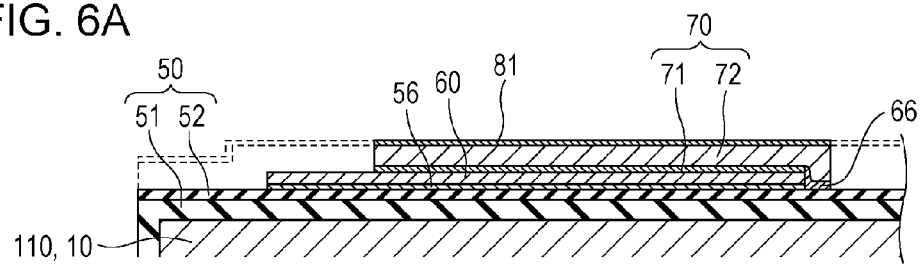
FIGS. 6A to 6C are cross-sectional views illustrating a process of manufacturing the recording head according to the first embodiment.

After forming the piezoelectric layer 70, as illustrated in FIG. 6A, the first layer 81 is formed on the second piezoelectric layer 72, and the first layer 81 and the second piezoelectric layer 72 are patterned, respectively, in correspondence with the pressure generating chamber 12. For example, the first layer 81 is formed by laminating an iridium layer including iridium and a titanium layer including titanium on the iridium layer. In addition, the iridium layer and the titanium layer can be formed by a sputtering method, a CVD method, and the like. In addition, for example, patterning of the first layer 81 and the second piezoelectric layer 72 is performed by using a so-called photolithography method in which a mask (not illustrated) formed with a predetermined shape is provided on the first layer 81, and the first layer 81 and the second piezoelectric layer 72 are etched through the mask. In addition, patterning of the first layer 81 and the second piezoelectric layer 72 may be performed, for example, by dry etching such as reactive ion etching and ion milling, wet etching, and the like.

Figure 6B:
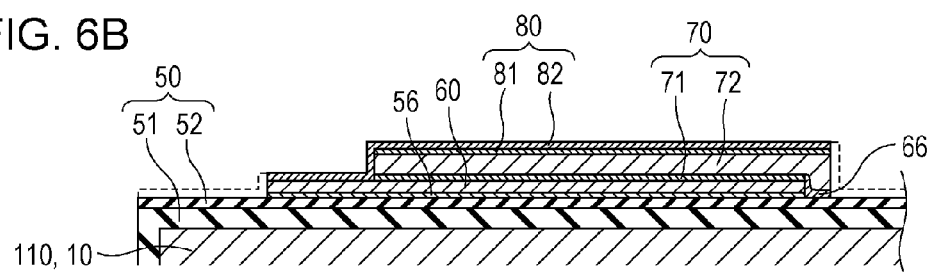

Next, as illustrated in FIG. 6B, the second layer 82 composed of, for example, iridium (Ir) is formed over a region on one surface side (a surface side in which the second piezoelectric layer 72 is formed) of the wafer 110 for a flow passage formed substrate, that is, over a region on the first layer 81, on a patterned side surface of the second piezoelectric layer 72, on the insulating film 52, and on the first electrode 60, and the second layer 82 is patterned to form the second electrode 80.

Figure 6C:
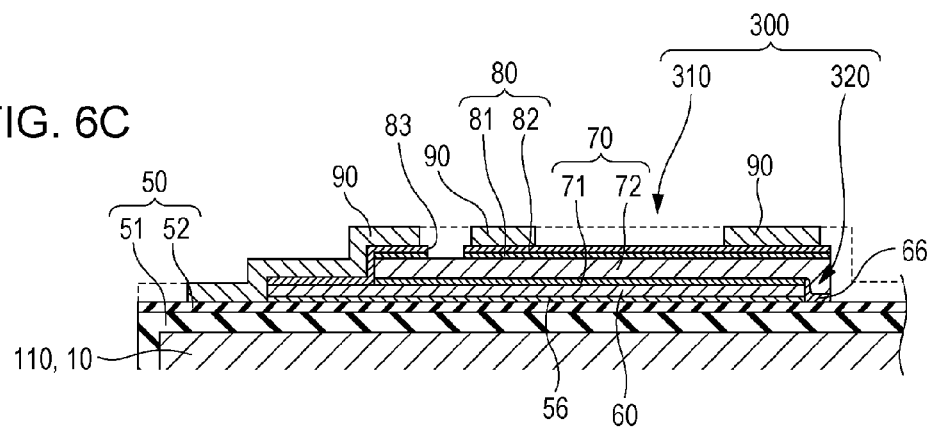

Next, as illustrated in FIG. 6C, over the entire surface of the wafer 110 for a flow passage formed substrate, the lead electrode 90 composed of gold (Au) or the like is formed, and then patterning is performed for each piezoelectric element 300 through a mask pattern (not illustrated) composed of a resist or the like. In addition, in the patterning of the piezoelectric element 300, a part of the second electrode 80 is simultaneously patterned to form a removed portion 83.

Figure 7A:
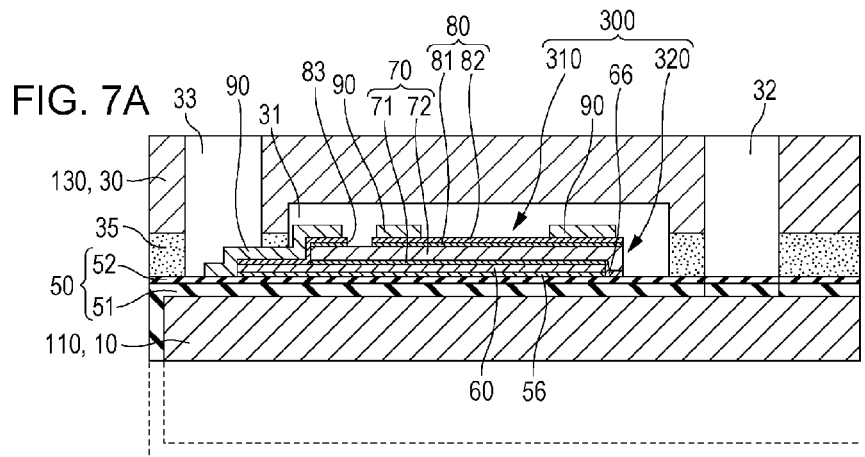
FIGS. 7A to 7C are cross-sectional views illustrating a process of manufacturing the recording head according to the first embodiment.

Next, as illustrated in FIG. 7A, a wafer 130 for a protective substrate, which is a silicon wafer and becomes a plurality of the protective substrate 30, is bonded to a piezoelectric element 300 side of the wafer 110 for a flow passage formed substrate through an adhesive 35, and then the wafer 110 for a flow passage formed substrate is processed to have a predetermined small thickness.

Figure 7B:
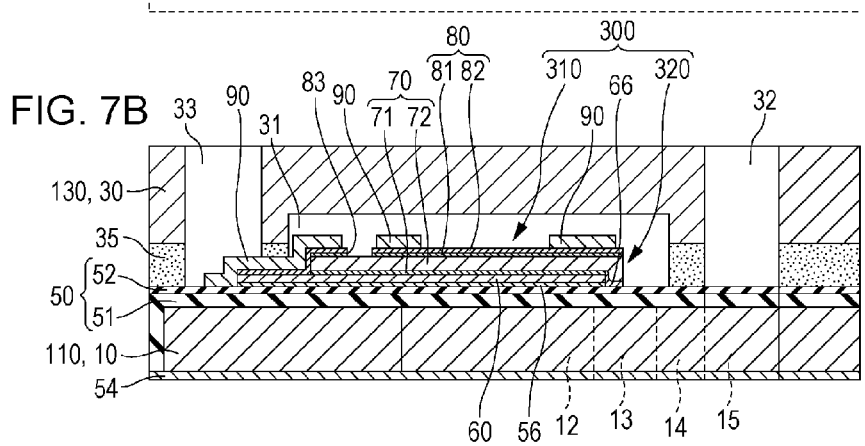

Next, as illustrated in FIG. 7B, a mask film 54 is newly formed on the wafer 110 for a flow passage formed substrate, and is patterned in a predetermined shape.

Figure 7C:
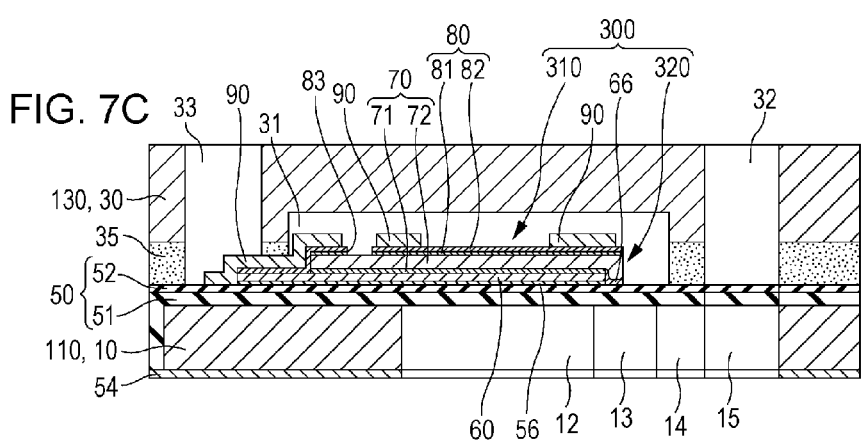

In addition, as illustrated in FIG. 7C, the wafer 110 for a flow passage formed substrate is subjected to anisotropic etching (wet etching) through the mask film 54 by using an alkali solution such as KOH to form the pressure generating chamber 12, the ink supply passage 13, the communication passage 14, the communication portion 15, and the like which correspond to the piezoelectric element 300.

Then, an unnecessary portion of an outer peripheral edge portion of the wafer 110 for a flow passage formed substrate and the wafer 130 for a protective substrate is cut and removed by, for example, dicing or the like. In addition, the mask film 54 on a surface of the wafer 110 for a flow passage formed substrate, which is opposite to the wafer 130 for a protective substrate, is removed. Then, the nozzle plate 20, through which the nozzle opening 21 is formed, is bonded to the surface from which the mask film 54 is removed, and the compliance substrate 40 is bonded to the wafer 130 for a protective substrate. Then, the wafer 110 for a flow passage formed substrate, and the like are divided into flow passage formed substrate 10, and the like which have a one chip size as illustrated in FIG. 1, thereby obtaining the ink jet type recording head I of this embodiment.

According to the method of manufacturing the liquid ejecting head of the invention, the first seed layer 65 and the second seed layer 66 can be formed in an arbitrary thickness, respectively, and thus fluctuation in orientation of the piezoelectric layer 70 is prevented at a boundary between the active portion 310 and the nonactive portion 320, and thus it is possible to allow the piezoelectric layer 70 to be preferentially oriented to the (100) face regardless of the base. Accordingly, it is possible to manufacture a liquid ejecting head capable of suppressing occurrence of cracks without a decrease in an amount of displacement.

Hereinafter, examples will be described, and the invention will be described in more detail. In addition, the invention is not limited to the following examples.

EXAMPLES

Example 1

Preparation of Substrate

First, a silicon dioxide film was formed as the elastic film 51 on a single crystal silicon substrate in a thickness of 1170 nm through thermal oxidation. Next, a zirconium film having a thickness of 285 nm was formed on the silicon dioxide film by a sputtering method, and the zirconium film was subjected to thermal oxidation to form a zirconium oxide film having a thickness of 400 nm as the insulating film 52. Then, a titanium film having a thickness of 20 nm was formed on the zirconium oxide film by the sputtering method, and the titanium film was subjected to thermal oxidation to form a titanium oxide film as the adhesive layer 56. Next, the first electrode 60, which was composed of a platinum film (Pt) having a thickness of 50 nm and was preferentially oriented to the (111) face, was formed on the titanium oxide film at 600° C. by the sputtering method, thereby obtaining an electrode-equipped substrate.

Preparation of Seed Layer Precursor Solution n-octane solutions (all solutions have a concentration of 0.5 mol/L, respectively) of bismuth 2-ethylhexanoate, iron 2-ethylhexanoate, and titanium 2-ethylhexanoate were mixed with each other in a molar ratio of Bi:Fe:Ti=120:60:40, thereby preparing a raw material solution including Bi, Fe, and Ti, and then the raw material solution was diluted with n-octane, thereby obtaining a seed layer precursor solution (hereinafter, referred to as a "BFT precursor solution"). In addition, a dilution ratio of the n-octane with respect to the raw material solution including Bi, Fe, and Ti was set to raw material solution:n-octane=1:11.

Preparation of Piezoelectric Layer Precursor Solution

To form the first piezoelectric layer 71 and the second piezoelectric layer 72 which were composed of a composite oxide having a perovskite structure including Bi, Ba, Fe, Ti, and Mn, respective n-octane solution of bismuth 2-ethylhexanoate, barium 2-ethylhexanoate, iron 2-ethylhexanoate, titanium 2-ethylhexanoate, and manganese 2-ethylhexanoate were mixed with each other in a molar ratio of Bi:Ba:Fe:Ti:Mn=75:25:71.25:25:3.75, thereby preparing a piezoelectric layer precursor solution (hereinafter, referred to as a "BFM-BT precursor solution") including Bi, Ba, Fe, Ti, and Mn.

Formation of First Seed Layer

The BFT precursor solution was added dropwise to the electrode-equipped substrate, and the electrode-equipped substrate was rotated at 3000 rpm so as to perform spin coating, thereby forming the first seed layer precursor layer (a seed layer precursor solution applying process). Next, the electrode-equipped substrate was heated on a hot plate retained at 180° C. for four minutes, and then was heated at 350° C. for four minutes (a seed layer drying process and a seed layer degreasing process). Next, the electrode-equipped substrate was fired at 700° C. for five minutes by using an RTA device (a seed layer firing process). Through the above-described processes, the first seed layer composed of a composite oxide having a perovskite structure including Bi, Fe, and Ti was formed in a thickness of 10 nm and in an island shape.

Formation of First Piezoelectric Layer

Next, the piezoelectric precursor solution was added dropwise to the electrode-equipped substrate, and the electrode-equipped substrate was rotated at 3000 rpm so as to perform spin coating, thereby forming the first piezoelectric layer precursor film (an application process). Next, the electrode-equipped substrate was heated on a hot plate retained at 180° C. for four minutes, and then was heated at 350° C. for four minutes (a drying process and a degreasing process). Next, the electrode-equipped substrate was fired at 750° C. for five minutes in an oxygen atmosphere by using the RTA device (a firing process). Through the above-described processes, the first piezoelectric layer 71 composed of a composite oxide having a perovskite structure including Bi, Ba, Fe, Ti, and Mn was formed in a thickness of 75 nm and in a film shape.

Processing of First Electrode, First Seed Layer, and First Piezoelectric Layer

The first electrode 60, the first seed layer 65, and the first piezoelectric layer 71 were collectively patterned by photolithography.

Formation of Second Seed Layer

The BFT precursor solution was added dropwise to the electrode-equipped substrate, and the electrode-equipped substrate was rotated at 3000 rpm so as to perform spin coating, thereby forming the second seed layer precursor layer (a seed layer precursor solution applying process). Next, the electrode-equipped substrate was heated on a hot plate retained at 180° C. for four minutes, and then was heated at 350° C. for four minutes (a seed layer drying process and a seed layer degreasing process). Next, the electrode-equipped substrate was fired at 700° C. for five minutes by using the RTA device (a seed layer firing process). Through the above-described processes, the second seed layer 66 composed of a composite oxide having a perovskite structure including Bi, Fe, and Ti was formed on the first electrode 60 in a thickness of 5 nm or less and in an island shape, and on the side surface of the first electrode 60 and on the insulating film 52 in a thickness of 30 nm and in a film shape.

Formation of Second Piezoelectric Layer

Next, the piezoelectric layer precursor solution was added dropwise to the electrode-equipped substrate, and the electrode-equipped substrate was rotated at 3000 rpm so as to perform spin coating, thereby forming the second piezoelectric layer precursor film (an application process). Next, the electrode-equipped substrate was heated on a hot plate retained at 180° C. for four minutes, and then was heated at 350° C. for four minutes (a drying process and a degreasing process). The processes including the application process, the drying process, and the degreasing process were repeated twice, and then the electrode-equipped substrate was fired at 750° C. for five minutes in an oxygen atmosphere by using the RTA device (a firing process). Next, processes including the application process, the drying process, the degreasing process, and the firing process were repeated six times in the same combination as described above, and thus the application was performed a total of 12 times, thereby forming a 12-layered second piezoelectric layer 72 composed of a composite oxide having a perovskite structure including Bi, Ba, Fe, Ti, and Mn in a total thickness of 900 nm.

Formation of Second Electrode and Piezoelectric Actuator

Next, an iridium film having a thickness of 50 nm was formed on the second piezoelectric layer 72 by a sputtering method, and the iridium film was patterned by photolithography in a desired size to form the second electrode 80.

According to this, a piezoelectric actuator provided with the piezoelectric element 300, which includes the vibrating plate 50 including the elastic film 51 and the insulating film 52, the first electrode 60, the first seed layer 65, the first piezoelectric layer 71, the second seed layer 66, the second piezoelectric layer 72, and the second electrode 80, was prepared.

Example 2

A piezoelectric actuator was prepared by the same method as in Example 1 except that the thickness of the platinum film, that constitutes the first electrode, was set to 130 nm.

Comparative Example 1

A piezoelectric actuator was prepared by the same method as in Example 1 except that after forming the first electrode, patterning was performed by photolithography, and the first seed layer, the first piezoelectric layer, and the second piezoelectric layer were not provided.

Comparative Example 2

A piezoelectric actuator was prepared by the same method in Example 1 except that the first seed layer was formed on the first electrode that was patterned in a thickness of 10 nm, and the second seed layer was formed on the insulating film adjacent to the first electrode in a thickness of 20 nm.

Comparative Example 3

A piezoelectric actuator was prepared by the same method as in Example 1 except that the first seed layer was formed on the first electrode that was patterned in a thickness of 20 nm, and the second seed layer was formed on the insulating film adjacent to the first electrode in a thickness of 40 nm.

Test Example 1

Figure 8:
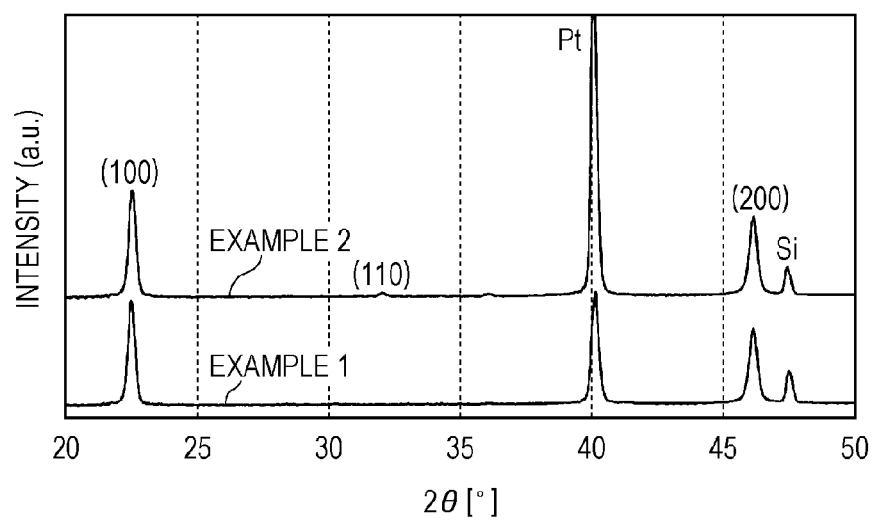
FIG. 8 is a view illustrating an X-ray diffraction pattern of a piezoelectric layer of an active portion in Examples 1 and 2.
Figure 9:
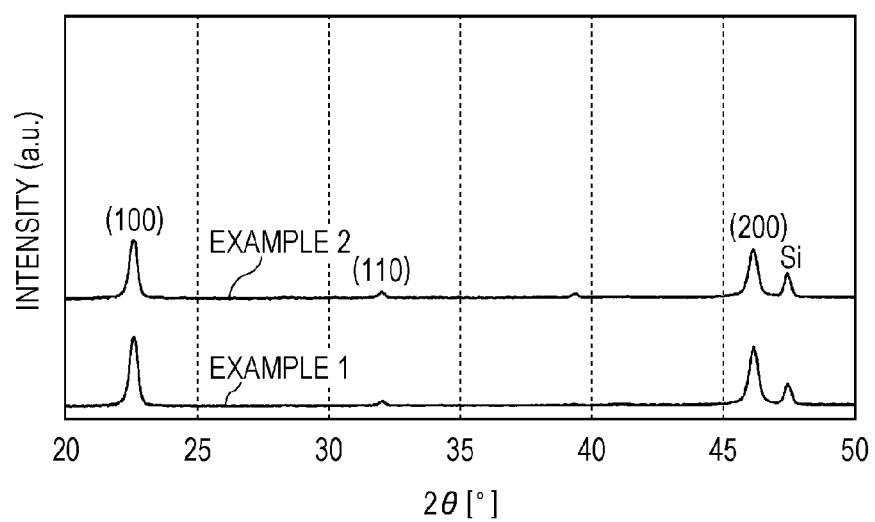
FIG. 9 is a view illustrating an X-ray diffraction pattern of a piezoelectric layer of a nonactive portion in Examples 1 and 2.
Figure 10:
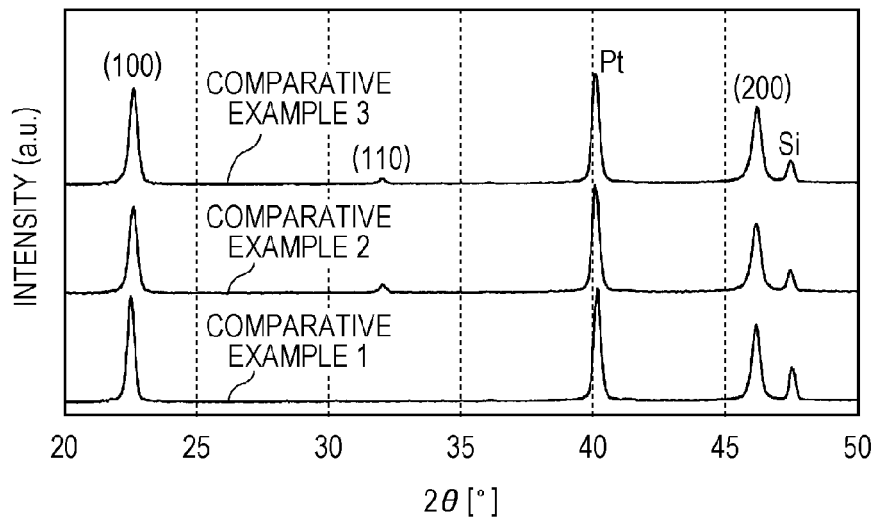
FIG. 10 is a view illustrating an X-ray diffraction pattern of a piezoelectric layer of an active portion in Comparative Examples 1 to 3.

With respect to Examples 1 and 2, and Comparative Examples 1 to 3 before formation of the second electrode, X-ray diffraction charts of the piezoelectric layer (an upper side of the first electrode) in the active portion, and the piezoelectric layer (an upper side of the insulating film) in the nonactive portion were obtained at room temperature by using "D8 Discover WithGADDS; a microregion X-ray diffraction device, manufactured by Bruker AXS Inc., and by using CuKα rays as an X-ray source. FIG. 8 illustrates an X-ray diffraction pattern of the piezoelectric layer in the active portion of Examples 1 and 2, and FIG. 9 illustrates an X-ray diffraction pattern of the piezoelectric layer in the nonactive portion of Examples 1 and 2. FIG. 10 illustrates an X-ray pattern of the piezoelectric layer in the active portion of Comparative Examples 1 to 3, and FIG. 11 illustrates an X-ray diffraction pattern of the piezoelectric layer in the nonactive portion of Comparative Examples 1 to 3.

Here, a peak in the vicinity of 2θ=22.5° is a peak derived from the (100) face, and a peak in the vicinity of 2θ=31.8° is a peak derived from the (110) face. From the peak intensity ratio, a value of (100)/[(100)+(110)] was obtained and the value was set as a (100) face orientation rate. Results are shown in Table 1.

As illustrated in FIGS. 8 and 9, in Examples 1 and 2 in which the first piezoelectric layer was formed through the first seed layer, and the second piezoelectric layer was formed through the second seed layer, it could be seen that in the active portion and the nonactive portion, preferential orientation was made to the (100) face with an orientation rate as high as at least 88% or greater. In addition, from the results of Examples 1 and 2, it was confirmed that even when the thickness of the first electrode was set to 50 nm or 130 nm, there was no effect on the orientation rate of the piezoelectric layer.

Figure 11:
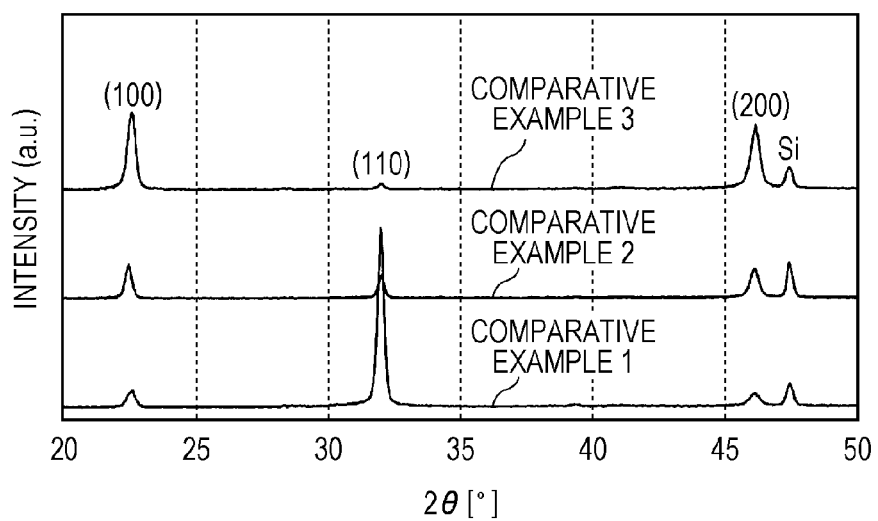
FIG. 11 is a view illustrating an X-ray diffraction pattern of a piezoelectric layer of a nonactive portion in Comparative Examples 1 to 3.

On the other hand, as illustrated in FIGS. 10 and 11, in Comparative Example 1 in which the second piezoelectric layer was formed without providing the first piezoelectric layer and the second seed layer, it could be seen that in the active portion, a peak of (100) face orientation was sharp, and preferential orientation was made to the (100) face, but in the nonactive portion, the peak of the (100) face orientation was hardly found (orientation rate of 8.0%), and preferential orientation was not made to the (100) face. In addition, in Comparative Example 2 in which the second piezoelectric layer was formed through the second seed layer having a thickness of 20 nm without providing the first piezoelectric layer, it could be seen that in the active portion, the peak of the (100) face orientation was sharp, and preferential orientation was made to the (100) face, but in the nonactive portion, the peak of the (100) face orientation was weak (orientation rate of 58.0%), and preferential orientation was not made to the (100) face. On the other hand, in Comparative Example 3 in which the second piezoelectric layer was formed through the second seed layer having a thickness of 40 nm without providing the first piezoelectric layer, it could be seen that in both the active portion and the nonactive portion, preferential orientation was made to the (100) face, but an amount of displacement was low similar to Test Example 3 to be described later.

Test Example 2

With respect to Examples 1 and 2, and Comparative Examples 1 to 3 before formation of the second electrode, a surface obtained after forming a piezoelectric layer in 900 nm was observed with a metal microscope with a magnification of 50 times to confirm whether or not cracks occurred in the piezoelectric layer. Results are shown in Table 1.

As shown in Table 1, in Examples 1 and 2, and Comparative Example 3, cracks were not observed, but a plurality of cracks were observed in Comparative Examples 1 and 2. From the observation, it could be seen that when forming the first piezoelectric layer through the first seed layer, it is possible to reliably suppress occurrence of cracks.

Test Example 3

Results obtained by examining fracture of an element by changing an application voltage are shown in Table 1. In Examples 1 and 2, and Comparative Example 3 in which cracks did not exist in the nonactive portion, it could be seen that a 50% break-down voltage exceeded 100 V. In contrast, in Comparative Examples 1 and 2 in which cracks existed in the nonactive portion, it could be seen that breakage was in progress with a low voltage.

Test Example 4

A liquid ejecting head provided with each of the piezoelectric element of Examples 1 and 2, and Comparative Examples 1 to 3 was prepared, and an amount of displacement of a piezoelectric element (CAV) in a case of performing voltage application with a pulse waveform of 45 V was obtained. The amount of displacement was expressed as a displacement ratio when displacement of Comparative Example 3 was set as "1", and the amount of displacement is shown in Table 1.

From the results, it could be seen that in the piezoelectric elements of Examples 1 and 2, and Comparative Examples 1 and 2, the amount of displacement was improved in comparison to Comparative Example 3.

From the results of Test Examples 1 to 3, it could be seen that when the first piezoelectric layer was formed through the first seed layer, and the second piezoelectric layer was formed through the second seed layer, the entirety of the piezoelectric layer was allowed to be preferentially oriented to the (100) face, and thus occurrence of cracks could be suppressed. In addition, it could be seen that the amount of displacement could be improved.

In addition, when a driving force of a drive motor is transmitted to the carriage 3 through a plurality of gears (not illustrated) and a timing belt 7, the carriage 3 on which the recording head units 1A and 1B are mounted moves along the carriage shaft 5. On the other hand, a transporting roller 8 as a transporting unit is provided to the device main body 4, and a recording sheet S that is a recording medium such as paper is transmitted by the transmitting roller 8. In addition, the transmitting unit that transmits the recording sheet S is not limited to the transmitting roller 8, and may be a belt, a drum, or the like.

In addition, in the above-described examples, as the ink jet type recording device II, an ink jet type recording device, in which the ink jet type recording head I is mounted on the

TABLE 1

| | | First seed layer | Second seed layer | | First piezo-electric layer Thickness | Second piezoelectric layer | | | | |
|---|---|---|---|---|---|---|---|---|---|---|
| | | | | | | (100) face orientation rate | | Crack in nonactive portion | 50% break-down voltage | Dis-placement ratio |
| | First electrode | Thickness $t_1$ | Thickness $t_3$ | Thickness $t_2$ | | Active portion | Nonactive portion | | | |
| Example 1 | Pt 50 nm | Island shape 10 nm | 5 nm or less | Film shape 30 nm | 75 nm | 98.6% | 91.0% | None | Greater than 100 V | 1.10 |
| Example 2 | Pt 130 nm | Island shape 10 nm | 5 nm or less | Film shape 30 nm | 75 nm | 96.0% | 88.7% | None | Greater than 100 V | 1.11 |
| Comparative Example 1 | Pt 50 nm | Island shape 10 nm | — | — | — | 97.2% | 8.0% | Existing | 53 V | 1.10 |
| Comparative Example 2 | Pt 50 nm | Island shape 10 nm | — | Film shape 20 nm | — | 89.7% | 58.0% | Existing | 69 V | 1.08 |
| Comparative Example 3 | Pt 50 nm | Island shape 20 nm | — | Film shape 40 nm | — | 93.3% | 91.5% | None | Greater than 100 V | 1.00 |

Other Embodiments

Hereinbefore, the embodiment of the invention has been described, but the invention is not limited to the above-described configurations. For example, the silicon single crystal substrate has been exemplified as the flow passage formed substrate 10. However, there is no particular limitation thereto, and for example, a material such as an SOI substrate and glass may be used.

In the above-described first embodiment, a liquid ejecting head, in which the first electrode 60 constitutes an individual electrode that is independently provided in correspondence with each of the pressure generating chambers and the second electrode 80 constitutes a common electrode that is continuously provided over a parallel arrangement direction of the pressure generating chamber 12, has been exemplified. However, the first electrode 60 may constitute the common electrode that is continuously provided over the parallel arrangement direction of the pressure generating chamber 12, and the second electrode 80 may constitute the individual electrode that is independently provided in correspondence with each of the pressure generating chamber 12.

Figure 12:
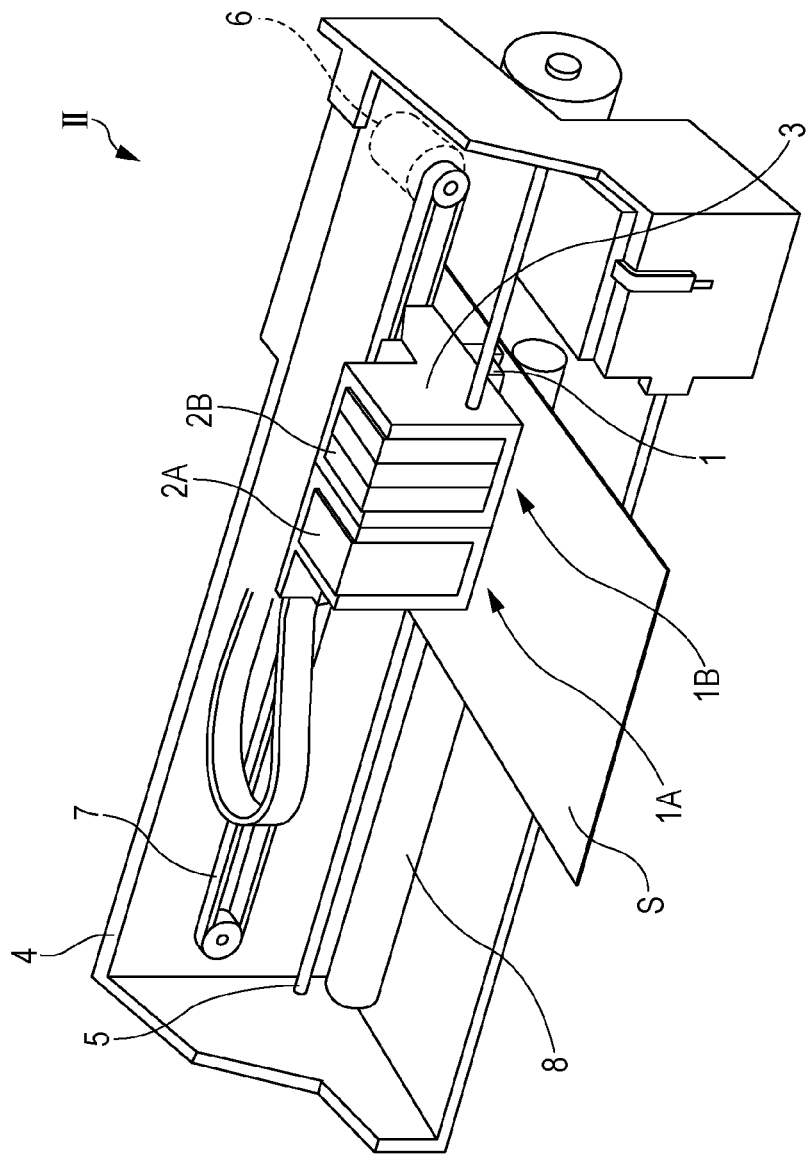
FIG. 12 is a view illustrating a schematic configuration of a recording device according to an embodiment of the invention.

In addition, for example, as illustrated in FIG. 12, the ink jet type recording head I (refer to FIG. 1) is mounted on an ink jet type recording device II. Cartridges 2A and 2B, which constitute an ink supply unit, are detachably mounted to recording head units 1A and 1B which include the ink jet type recording head I, respectively, and a carriage 3 on which the recording head units 1A and 1B are mounted is provided to a carriage shaft 5, which is attached to a device main body 4, in a movable manner in the an axial direction. For example, the recording head units 1A and 1B eject a black ink composition, and a color ink composition.

carrier 3 and moves a main scanning direction, has been exemplified, the configuration of the ink jet type recording device is not particularly limited thereto. For example, the ink jet type recording device II may be a so-called in-line type recording device in which the ink jet type recording head I is fixed, and the recording sheet S such as paper is allowed to move in a sub-scanning direction to perform printing.

In addition, in the above-described embodiment, as an example of the liquid ejecting head, the ink jet type recording head I has been described. However, the invention is broadly targeted to whole liquid ejecting heads, and is also applicable to liquid ejecting heads that eject liquids other than ink. Examples of other liquid ejecting heads include various recording heads that are used for an image recording apparatus such as a printer, a color material ejecting head that is used to manufacture color filters of a liquid crystal display and the like, an electrode material ejecting head that is used to form electrodes of an organic EL display, a field emission display (FED), and the like, a biogenic organic material ejecting head that is used to manufacture a biochip, and the like.

In addition, the piezoelectric element according to the invention is not limited to a piezoelectric element that is used in the liquid ejecting head, and can be used in other devices. Examples of other device include an ultrasonic device such as an ultrasonic transmitter, an ultrasonic motor, a temperature-electricity converter, a pressure-electricity converter, a ferroelectric transmitter, a piezoelectric transformer, filters such as a filter that shields a harmful light beam such as an infrared ray, an optical filter that uses a photonic crystal effect by formation of quantum dots, and an optical filter that uses optical interference of a thin film, and the like. In addition, the invention is also applicable to a piezoelectric element that is used as a sensor, and a piezoelectric element that is used as a ferroelectric memory. Examples of sensors using the piezoelectric element include an infrared sensor, an ultrasonic sensor, a heat sensitive sensor, a pressure sensor, a pyroelectric sensor, a gyro sensor (angular velocity sensor), and the like.

The entire disclosure of Japanese Patent Application No. 2014-029355, filed Feb. 19, 2014 is expressly incorporated by reference herein.

What is claimed is:

1. A piezoelectric actuator comprising:
a vibrating plate;
a first electrode provided on the vibrating plate;
a first seed layer provided on the first electrode;
a second seed layer provided on the vibrating plate at least at a position adjacent to the first electrode;
a first piezoelectric layer provided on the first seed layer, the first piezoelectric layer having a perovskite structure and preferentially oriented to a (100) face;
a second piezoelectric layer provided to cover the first piezoelectric layer and the second seed layer, the second piezoelectric layer preferentially oriented to a (100) face; and
a second electrode provided on the second piezoelectric layer.

2. The piezoelectric actuator according to claim 1, wherein the first seed layer has a thickness smaller than a thickness of the second seed layer.

3. The piezoelectric actuator according to claim 1, wherein the thickness of the first seed layer is less than 20 nm.

4. The piezoelectric actuator according to claim 1, wherein the thickness of second seed layer is in a range of 20 nm to 80 nm.

5. The piezoelectric actuator according to claim 1, wherein an occupancy rate of the first seed layer in the first piezoelectric layer is 30% or greater.

6. The piezoelectric actuator according to claim 1, wherein the second seed layer extends from the vibrating plate side to the first piezoelectric layer side.

7. The piezoelectric actuator according to claim 6, wherein the thickness of the second seed layer on the vibrating plate side is smaller than the thickness on the first piezoelectric layer side.

8. The piezoelectric actuator according to claim 1, wherein the first electrode is composed of platinum that is preferentially oriented to a (111) face.

9. The piezoelectric actuator according to claim 1, wherein the first seed layer and the second seed layer is composed of a composite oxide having a perovskite structure including bismuth, iron, and titanium.

10. A liquid ejecting head, comprising:
the piezoelectric actuator according to claim 1.

11. A method of manufacturing a piezoelectric actuator comprising:
Forming a vibrating plate;
forming a first electrode, a first seed layer, a the first piezoelectric layer in this order on the vibrating plate;
collectively patterning the first electrode, the first seed layer, and the first piezoelectric layer;
forming a second seed layer on the vibrating plate at least at a position adjacent to the first electrode; and
forming a second piezoelectric layer to cover the first piezoelectric layer and the second seed layer.

12. The method of manufacturing a piezoelectric actuator according to claim 11, wherein the first seed layer is formed in a thickness smaller than a thickness of the second seed layer.

13. The method of manufacturing a piezoelectric actuator according to claim 11, wherein the second seed layer is formed by a liquid phase method.

* * * * *